(12) United States Patent
Kim

(10) Patent No.: US 6,477,076 B2
(45) Date of Patent: Nov. 5, 2002

(54) FERROELECTRIC MEMORY DEVICE HAVING A FERROELECTRIC CAPACITOR DISPOSED ON AN EXTENDED ACTIVE AREA

(75) Inventor: Jae-Whan Kim, Kyoungki-do (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/740,946

(22) Filed: Dec. 21, 2000

(65) Prior Publication Data

US 2001/0023950 A1 Sep. 27, 2001

(30) Foreign Application Priority Data

Dec. 28, 1999 (KR) .............................................. 99-64086

(51) Int. Cl.$^7$ ................................................. G11C 5/06
(52) U.S. Cl. .......................... 365/65; 365/117; 365/145
(58) Field of Search ................................. 365/145, 117, 365/51, 65

(56) References Cited

U.S. PATENT DOCUMENTS

| 5,121,353 A | * 6/1992 | Natori ........................ 257/295 |
| 5,224,069 A | 6/1993 | Natori |
| 5,455,786 A | 10/1995 | Takeuchi et al. ............. 365/145 |
| 5,539,279 A | 7/1996 | Takeuchi et al. ............. 365/145 |
| 6,028,784 A | * 2/2000 | Mori et al. .................. 365/145 |
| 6,288,931 B1 | * 9/2001 | Kye et al. .................... 365/145 |

FOREIGN PATENT DOCUMENTS

| DE | 199 54 845 A1 | 5/2000 |
| EP | 0 996 163 A2 | 10/1999 |
| TW | 396551 | 12/2000 |

* cited by examiner

Primary Examiner—David Nelms
Assistant Examiner—Thong Le
(74) Attorney, Agent, or Firm—Finnegan, Henderson, Farabow, Garrett & Dunner, L.L.P.

(57) ABSTRACT

Disclosed is a ferroelectric memory device, which prevents a potential difference across a ferroelectric capacitor from being occurred and minimizes a step to be induced during the fabrication of the capacitor. The memory device comprises a first switching transistor having its gate coupled to a positive wordline, and its source and drain coupled between a bitline and a first node respectively; a ferroelectric capacitor coupled between the first node and a plateline; and a second switching transistor having its gate coupled to a negative wordline, and its source and drain coupled to the first node and the plateline respectively. A second node at which the source of the second switching transistor and the plateline are contacted is formed on an active area locating between two adjacent negative wordlines; and the ferroelectric capacitor is formed on the active area. The active area is broadly formed to prevent a resistance of the second node from being occurred.

4 Claims, 8 Drawing Sheets

US 6,477,076 B2

FERROELECTRIC MEMORY DEVICE HAVING A FERROELECTRIC CAPACITOR DISPOSED ON AN EXTENDED ACTIVE AREA

CROSS-REFERENCE TO RELATED APPLICATIONS

Priority is claimed from Republic of Korea Patent Application No. 1999-64086 filed Dec. 28, 1999.

FIELD OF THE INVENTION

The present invention relates to a semiconductor memory device; and, more particularly, to a ferroelectric memory device, which employs as a data storage device a ferroelectric capacitor, obtained by using a ferroelectric material as a dielectric of the capacitor.

DESCRIPTION OF THE PRIOR ART

As is well known, since a capacitor made of a ferroelectric material serves to sense a variation in an electric charge induced by a voltage applied across the capacitor and accumulates the sensed value as data therein, it is being utilized as a nonvolatile memory device.

FIG. 1 is a connection diagram of a unit cell in a conventional ferroelectric memory device. In FIG. 1, two unit cells, each of which including a switching transistor 11 and a ferroelectric capacitor 12, are shown.

Referring to FIG. 1, the switching transistor 11 in one unit cell has its gate coupled to a wordline WL1 which controls the switching transistor 11, its source coupled to a bitline BL and its drain coupled to one end (i.e., storage electrode) of the ferroelectric capacitor 12. The other end of the ferroelectric capacitor 12 is coupled to a plateline PL. As with the conventional DRAM, a voltage at the plateline PL is a half line input voltage, i.e., Vcc/2.

In such a configuration, the plateline PL and an initial voltage of a node A, which corresponds to the storage electrode, maintain the Vcc/2 during a standby mode, respectively.

In such standby mode, however, the node A has a junction capacitance and a junction resistance to cause a leakage current. The leakage current allows a potential across the node A to be gradually decreased. The decrease in potential across the node A causes a potential difference across the ferroelectric capacitor 12, resulting in a decrease in the electric charge accumulated therein. To overcome such problems, used in the prior art is a technique which precharges the bitline BL by Vcc/2 and then subsequently turning the wordline WL on, to recover the potential across the node A to Vcc/2. Unfortunately, the prior art technique suffers from a drawback that a continuous vibration in the node A with small width entails a loss of the accumulated charge.

FIG. 2 is a pictorial representation showing the structure of a memory cell, which has been descented in a commonly owned Korean patent application, Korean Ser. No. 1997/051050.

Referring to FIG. 2, the memory cell includes a first switching transistor 21 having its gate coupled to a positive wordline WL1, and its source and drain coupled between a bitline BL and a node A respectively, a ferroelectric capacitor 22 coupled between the node A and the plateline PL, and a second switching transistor 23 having its gate coupled to a negative wordline WL1, and its source and drain coupled to the node A and the plateline PL respectively. Since the gate of the first switching transistor 21 is coupled to the positive wordline WL1 and the gate of the second switching transistor 23 is coupled to the negative wordline WL1 having opposite sign to the positive wordline WL1, these transistors are alternatively turned on.

That is to say, in the memory cell shown in FIG. 2, a voltage applied to the plateline PL, i.e., Vcc/2, is relayed to the node B at all times, and the negative wordline WL1 is activated during inactivation of the positive wordline WL1, to thereby prevent a potential difference across the ferroelectric capacitor 22 from being occurred.

However, various fashions have been applied in layout considerations of the memory cell with such structure, but a variety of defects are invoked in setting the ferroelectric capacitor in array.

Typically, the capacitor is disposed on top of an element isolation film (field oxidation film), which is used to separate between devices or cells. As such, a substantially increased step is incurred after the fabrication of the ferroelectric capacitor. In addition, the presence of a resistance at the node B prevents the same voltage as the plateline PL from being relayed to the node A acting as the storage electrode of the ferroelectric capacitor, resulting in a slight potential difference across the ferroelectric capacitor.

SUMMARY OF THE INVENTION

It is, therefore, a primary object of the present invention to provide a ferroelectric memory device, which is capable of preventing a potential difference across a ferroelectric capacitor from being occurred and minimizing a step to be induced during the fabrication of the ferroelectric capacitor.

In accordance with one aspect of the present invention, there is provided a ferroelectric memory device, comprising: a first switching transistor having its gate coupled to a positive wordline, and its source and drain coupled between a bitline and a first node respectively; a ferroelectric capacitor coupled between the first node and a plateline; a second switching transistor having its gate coupled to a negative wordline, and its source and drain coupled to the first node and the plateline respectively; wherein a second node at which the source of the second switching transistor and the plateline are contacted is formed on an active area locating between two adjacent negative wordlines; and the ferroelectric capacitor is formed on the active area.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

Figure 1:
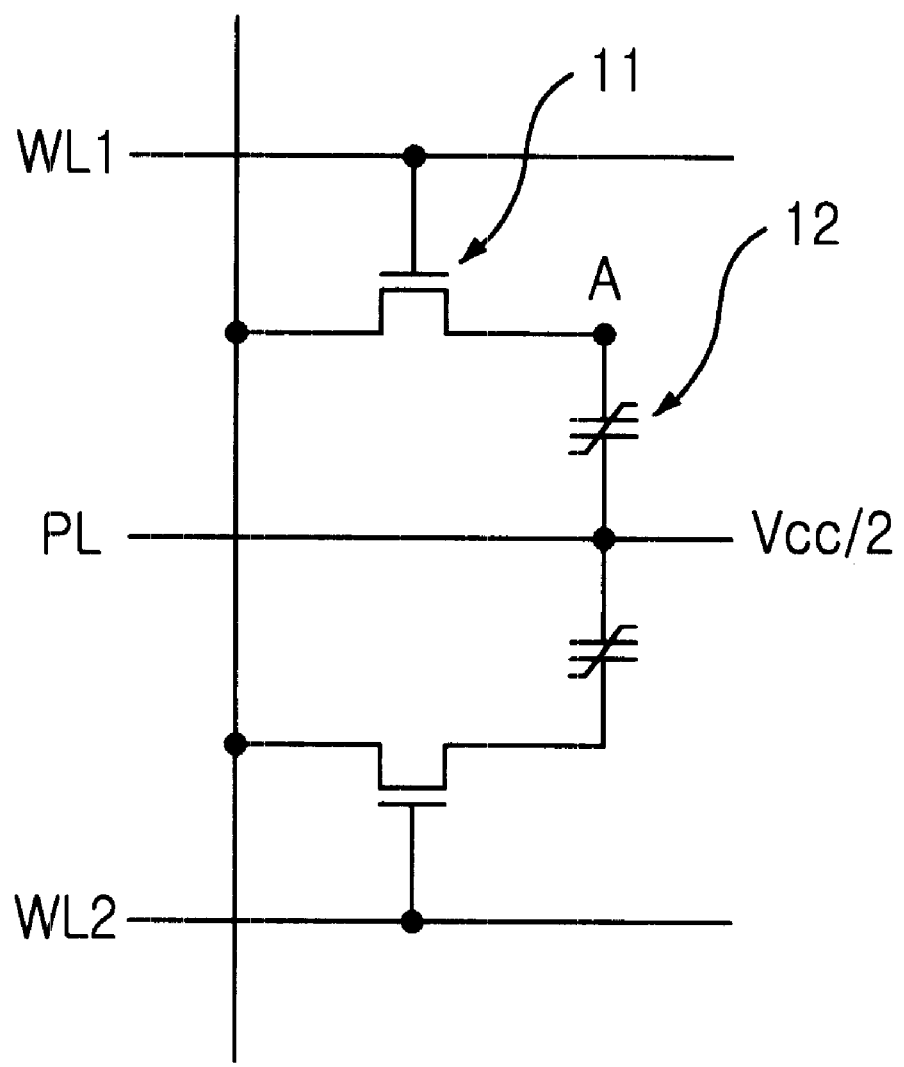
FIG. 1 is a connection diagram of a unit cell in a conventional ferroelectric memory device, which shows only two unit cells, each of which including one switching transistor and one ferroelectric capacitor.
Figure 2:
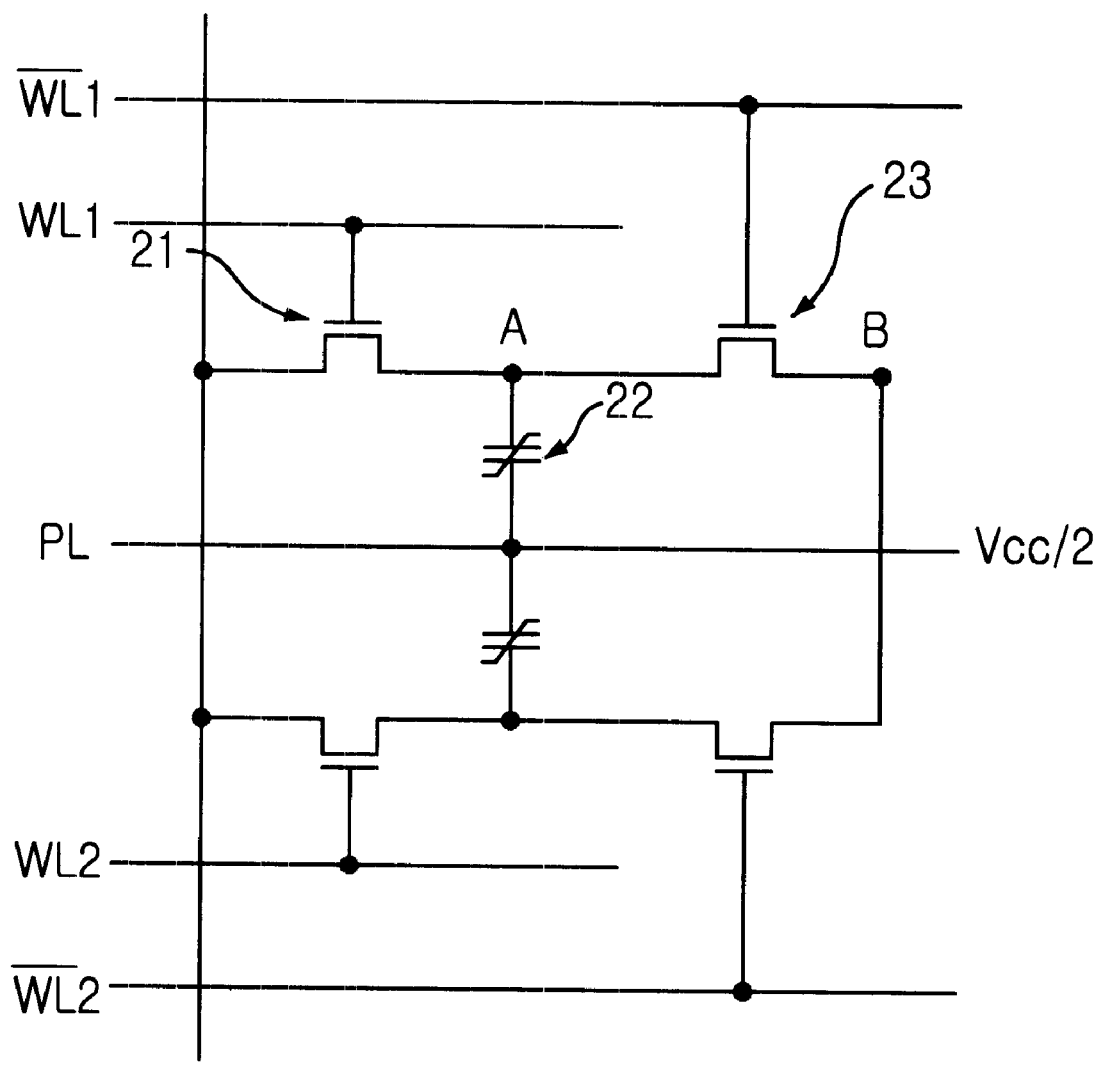
FIG. 2 is a pictorial representation showing a structure of a conventional memory cell.
Figure 3:
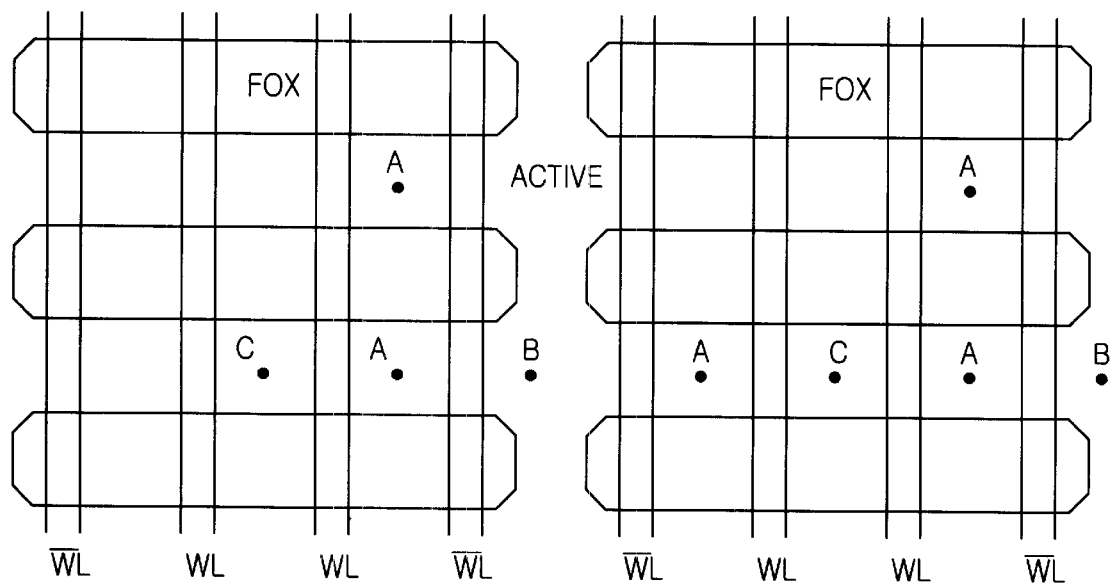
FIG. 3 is a schematic layout for implementing the memory cell shown in FIG. 2.

Referring to FIG. 3, there is shown a schematic layout for implementing the memory cell shown in FIG. 2.

As shown in FIG. 3, a relative position between an active area, a positive wordline WL, a negative wordline WL and a field oxidation area FOX is presented. In such a configuration, two positive wordlines and two negative wordlines pass through the field oxidation area FOX, which are placed in parallel with one another and are separated by the active area. The two positive wordlines are disposed between the two negative wordlines. A node C, which is contacted to the bitline BL, is positioned at which is surrounded by the two positive wordlines and two field oxidation areas FOXs, and a node A is positioned at a portion which is surrounded by one positive wordline WL, one negative wordline WL and two field oxidation areas FOXs. And, a node B, which relays the voltage of the plateline PL to the node A through the second switching transistor 23, is disposed at the active area located between two adjacent negative wordlines.

FIGS. 4A to 4D are pictorial representations of layouts of the ferroelectric memory device in accordance with a preferred embodiment of the present invention, which shows a relative position between the active area, the positive wordline WL, the negative wordline WL, the field oxidation are FOX, the bitline BL, the ferroelectric capacitor, and a connection line connecting therebetween are presented.

Figure 4A:
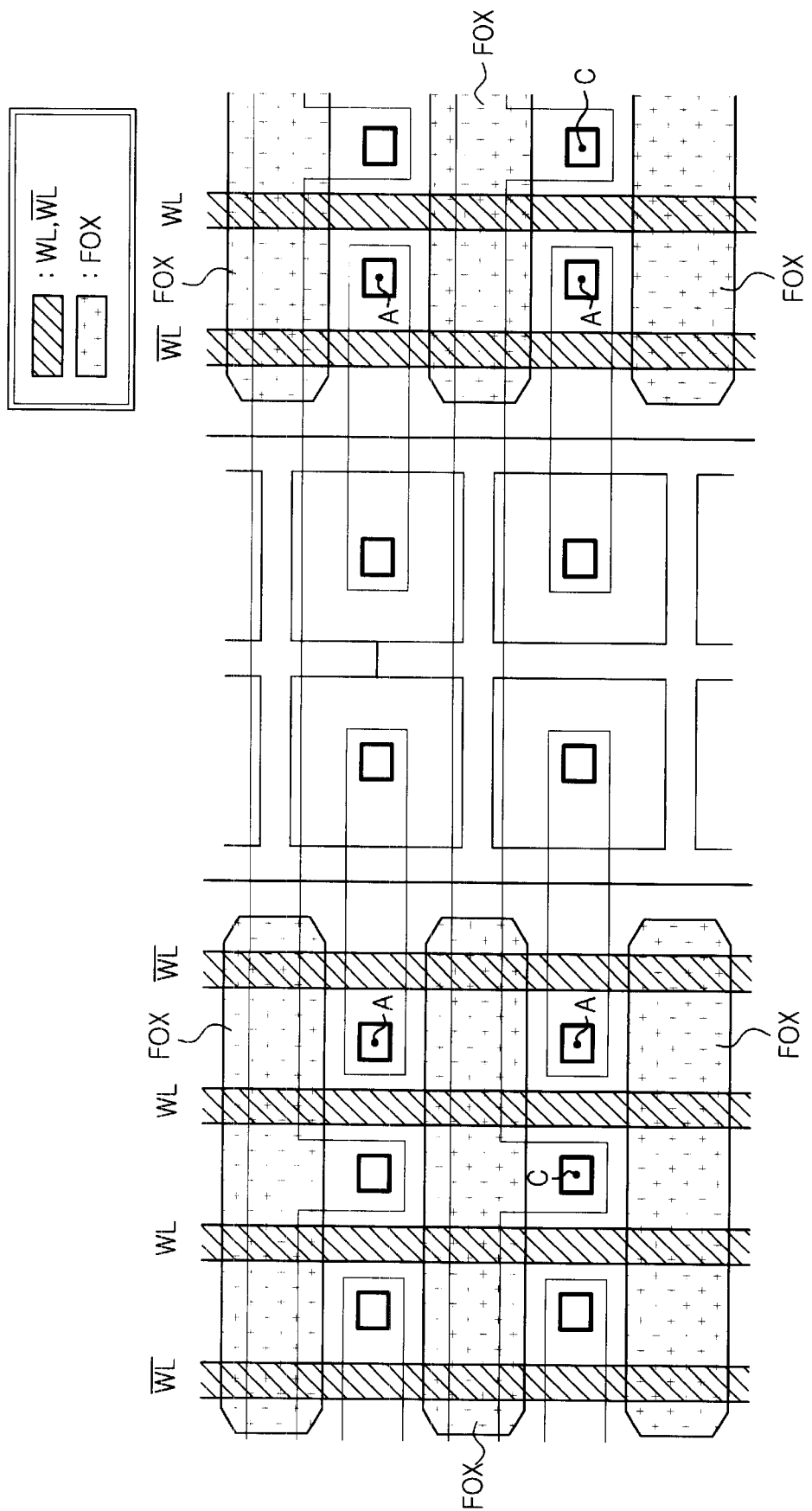
FIGS. 4A, 4B, 4C and 4D are pictorial representations of layouts of the ferroelectric memory device in accordance with a preferred embodiment of the present invention.

In FIG. 4A, the relative position between the field oxidation area FOX, the positive wordline WL and the negative wordline WL is similar to that previously described in conjunction with FIG. 3, and therefore a further description thereof is omitted herein.

Figure 4B:
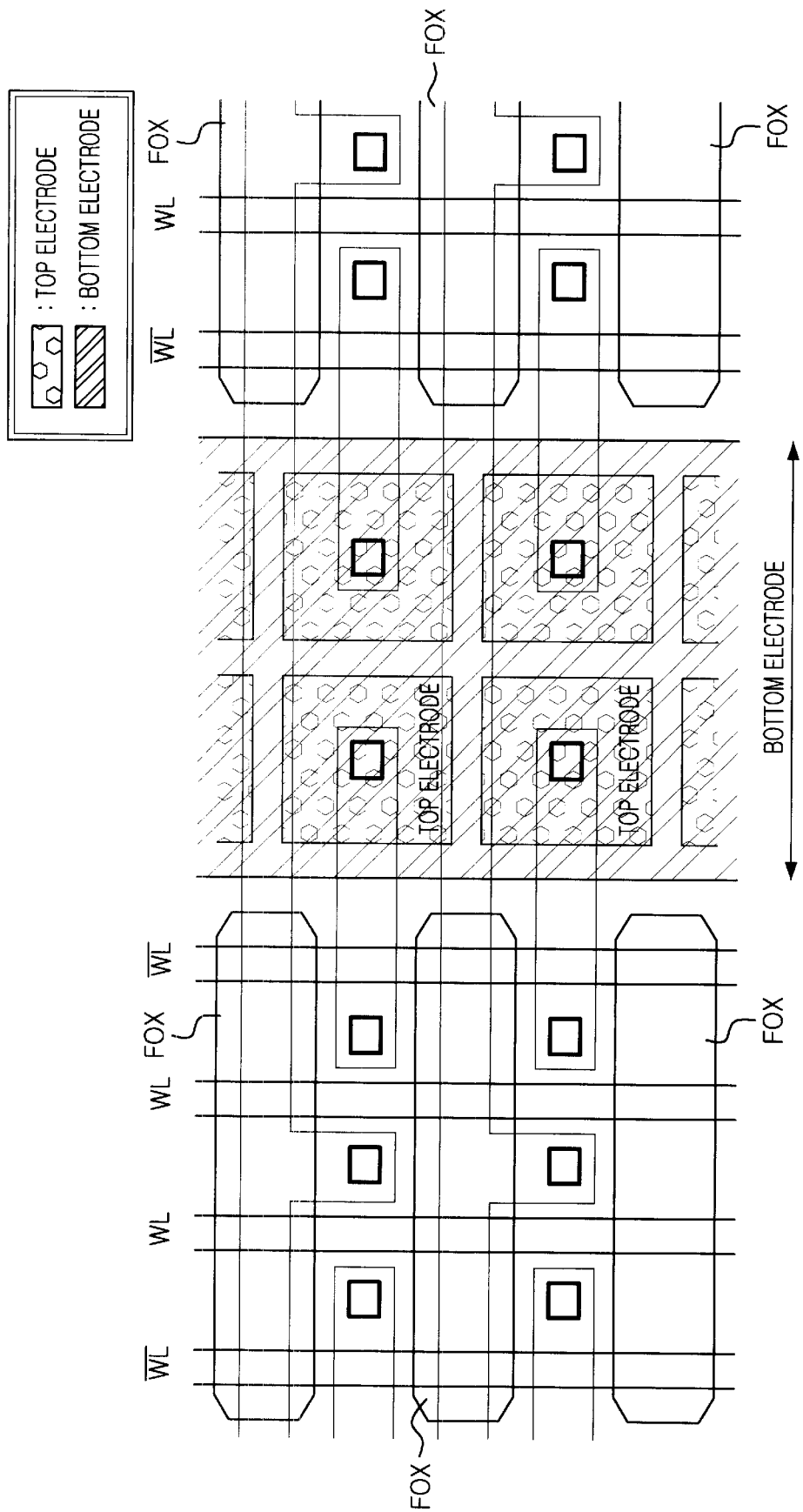

FIG. 4B shows a detailed pictorial representation of the ferroelectric capacitor disposed on an extended active area, which has a bottom electrode followed by a top electrode is formed. That is, the bottom electrode corresponds to the plateline PL.

Figure 4C:
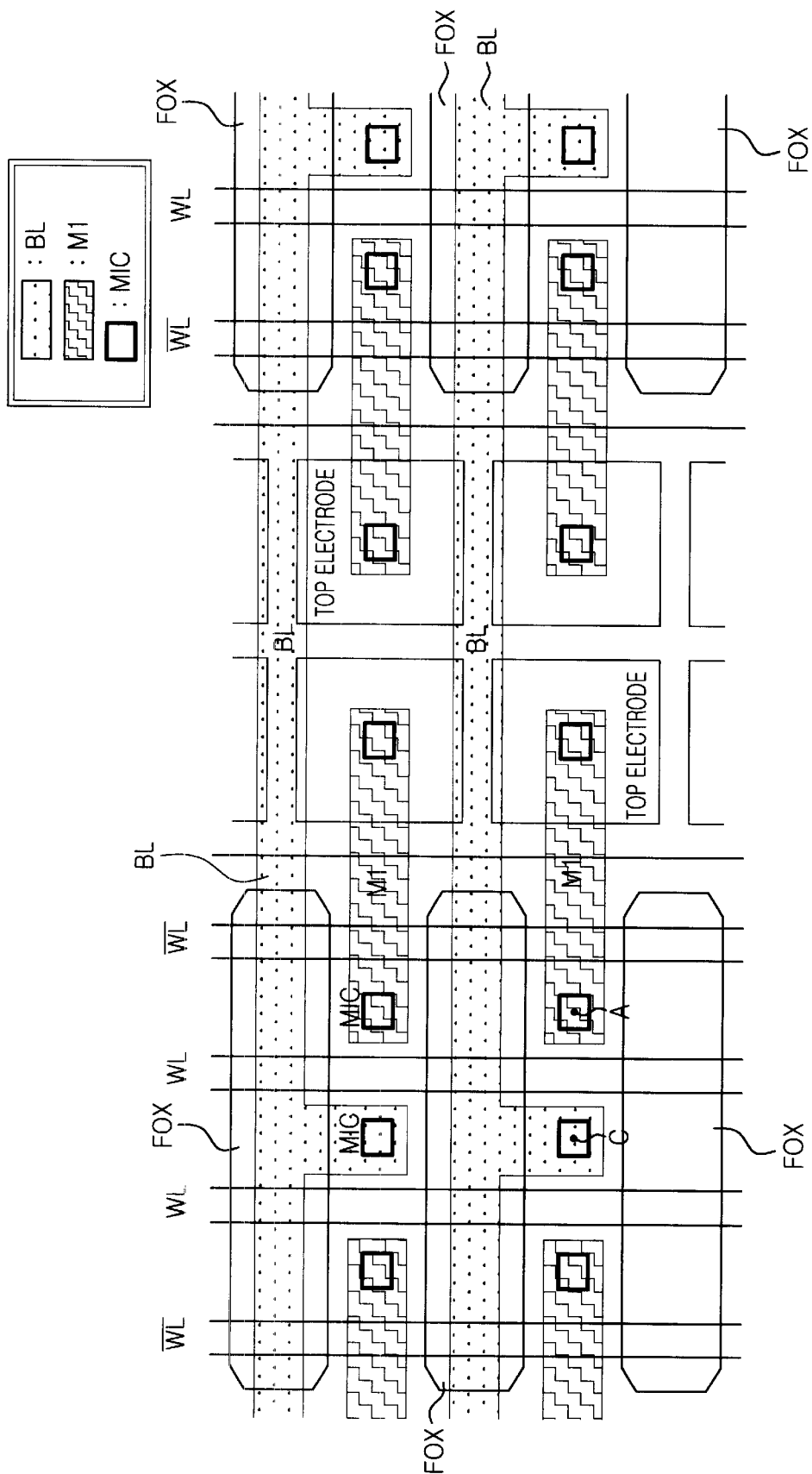

FIG. 4C is a detailed pictorial representation showing the bitline BL contacted to the node C and a metal line M1. In FIG. 4C, the metal line M1 functions as a connection wire for connecting between the node A and the top electrode of the ferroelectric capacitor, and the bitline BL extends to the same direction as the field oxidation area.

Figure 4D:
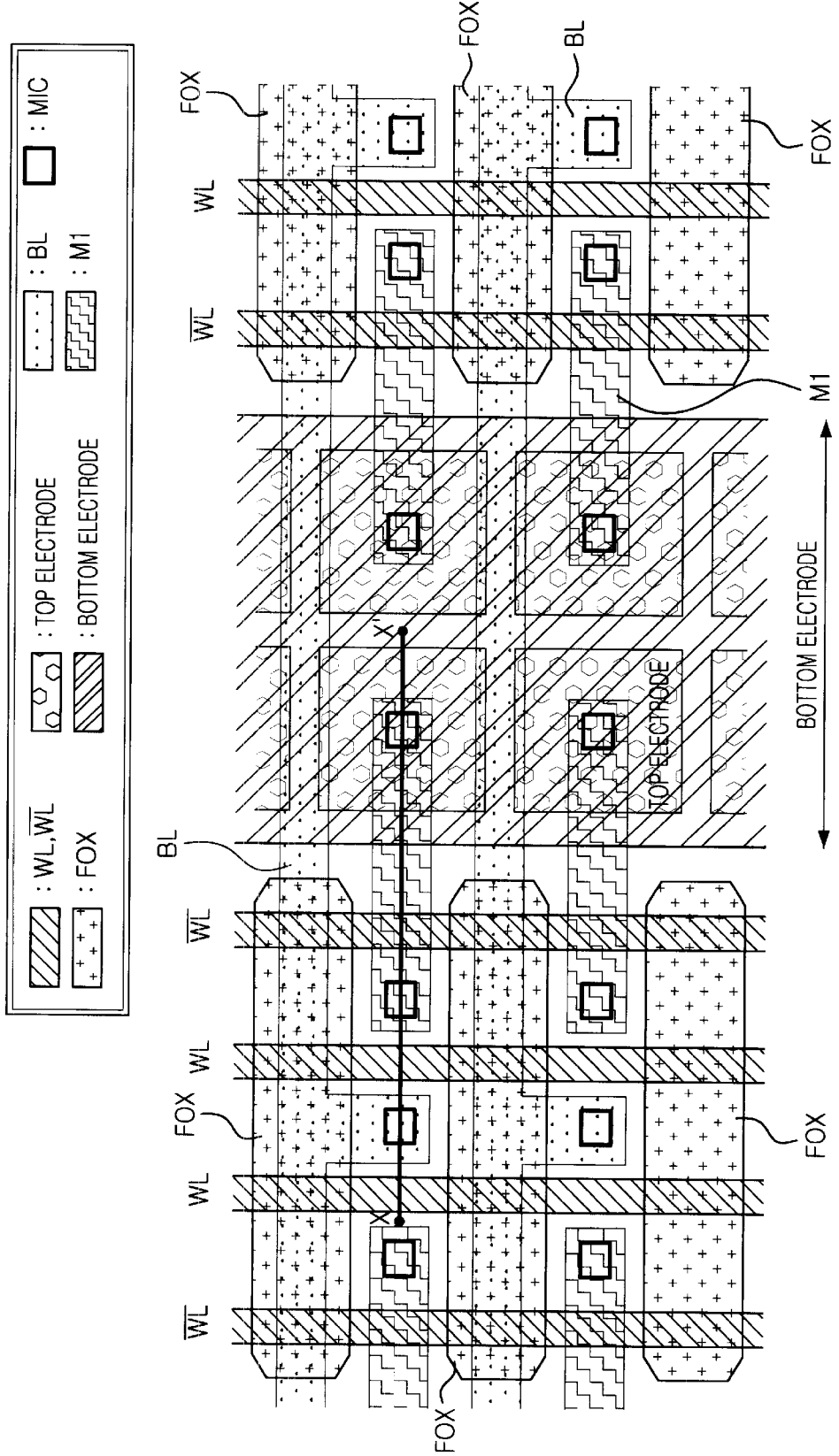
Figure 5:
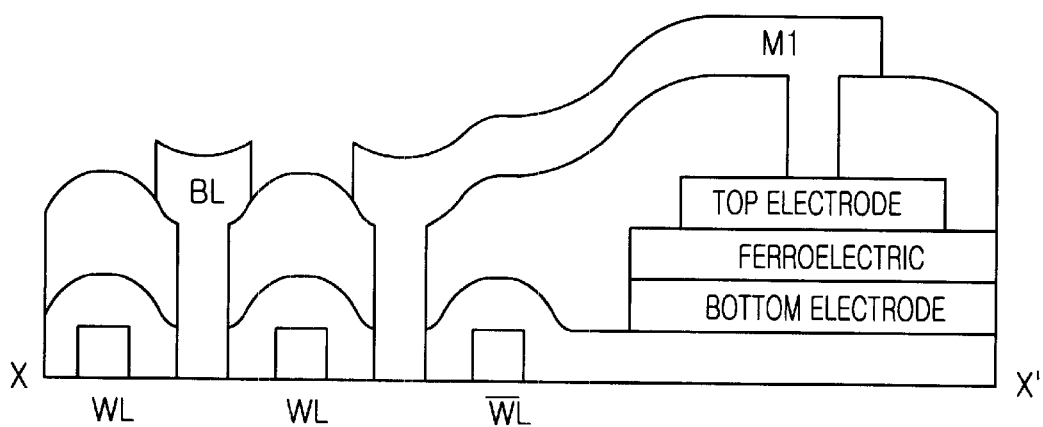
FIG. 5 is a sectional view taken along on line X–X' in FIG. 4D.

FIG. 4D presents the overall layout of the ferroelectric memory device in accordance with a preferred embodiment of the present invention. FIG. 5 is a sectional view taken along line X–X' in FIG. 4D.

In the above, although a portion at which the node B and the plateline PL are contacted is not illustrated, it is possible to connect the plateline PL and the node B, through the use of edges of one block including a multiplicity of memory cells, i.e., by connecting between the top electrode of the ferroelectric capacitor and the node A, at the distal end of the plateline PL passing through the multiplicity of memory cells.

It should be pointed out that the extended active area is disposed between the two adjacent negative wordlines, and the ferroelectric capacitor is formed on the extended active area.

Specifically, since the node B is positioned on a relatively broad active area, it is possible to maintain the resistance of the node B at minimum, to thereby exactly relay the same voltage as the plateline PL to the storage node A. Accordingly, the present invention has the ability to prevent a potential difference across the ferroelectric capacitor from being incurred.

Furthermore, in accordance with the present invention, since the ferroelectric capacitor is formed on a flat active area, it is possible to substantially reduce a bottom step to be occurred during fabrication processes of the ferroelectric capacitor, to thereby achieve the fabrication processes easily and suppress an additional step to be invoked after forming the ferroelectric capacitor.

Moreover, since the plateline PL and the node B are disposed adjacent each other, it allows a capacitance coupling between them to be enhanced, to thereby prevent a temporal voltage difference in the ferroelectric capacitor due to noises from being occurred.

As mentioned above, the present invention provides a memory cell incorporating therein one transistor for compensating a loss of an electric charge to be induced by a junction leakage current, which is generated at a storage node of the memory cell, extends an active area in which a node A is coupled to one end of the transistor and a plateline, and forms a ferroelectric capacitor on the extended active area, to thereby prevent an unwanted potential difference across the ferroelectric capacitor from being occurred and permit the fabrication processes of the semiconductor memory easily and simply.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A ferroelectric memory device, comprising:
    a first switching transistor having a gate coupled to a positive wordline, and a source and a drain coupled between a bitline and a first node;
    a ferroelectric capacitor in an active area between a pair of adjacent negative wordlines and coupled between the first node and a plateline; and
    a second switching transistor having a gate coupled to a negative wordline, and a source and a drain coupled to the first node and the plateline, respectively, the source of the second switching transistor and the plateline contacting a second node in the active area.

2. The ferroelectric memory device of claim 1, wherein the active area is sufficiently large to incur no resistance in the second node.

3. The ferroelectric memory device of claim 1, wherein the positive and negative wordlines are in parallel with one another and pass through a field oxidation area, and a pair of adjacent positive wordlines are surrounded by a pair of the negative wordlines; and
    wherein the bitline electrically contracts the active area, which is surrounded by a pair of the positive wordlines and a pair of the field oxidation areas, and passes through the field oxidation area.

4. The ferroelectric memory device of claim 3, wherein the ferroelectric capacitor electrically contact the active area which is positioned at a portion surrounded by the positive wordline, the negative wordline and the two field oxidation areas, through a connection wire.

* * * * *